(12) United States Patent
Kabir et al.

(10) Patent No.: US 12,119,300 B2
(45) Date of Patent: Oct. 15, 2024

(54) TRANSISTOR CIRCUITS WITH SHIELDED REFERENCE TRANSISTORS

(71) Applicant: NXP USA, Inc., Austin, TX (US)

(72) Inventors: Humayun Kabir, Gilbert, AZ (US); Ibrahim Khalil, Gilbert, AZ (US); Daniel Joseph Lamey, Chandler, AZ (US); Yu-Ting David Wu, Schaumburg, IL (US)

(73) Assignee: NXP USA, Inc., Austin, TX (US)

( * ) Notice: Subject to any disclaimer, the term of this patent is extended or adjusted under 35 U.S.C. 154(b) by 326 days.

(21) Appl. No.: 17/663,181

(22) Filed: May 12, 2022

(65) Prior Publication Data

US 2023/0369205 A1    Nov. 16, 2023

(51) Int. Cl.
| | |
|---|---|
| *H01L 25/10* | (2006.01) |
| *H01L 21/8234* | (2006.01) |
| *H01L 23/528* | (2006.01) |
| *H01L 27/088* | (2006.01) |
| *H01L 29/40* | (2006.01) |
| *H01L 29/417* | (2006.01) |
| *H03K 17/687* | (2006.01) |

(52) U.S. Cl.
CPC .... *H01L 23/528* (2013.01); *H01L 21/823475* (2013.01); *H01L 25/105* (2013.01); *H01L 27/088* (2013.01); *H01L 29/401* (2013.01); *H01L 29/41725* (2013.01); *H03K 17/6871* (2013.01)

(58) Field of Classification Search
CPC .......... H01L 21/823475; H01L 27/088; H01L 29/401; H01L 29/41725; H03K 17/6871
See application file for complete search history.

(56) References Cited

U.S. PATENT DOCUMENTS

| | | |
|---|---|---|
| 5,521,419 A | 5/1996 | Wakamiya et al. |
| 9,093,130 B2 | 7/2015 | Chen et al. |
| 10,714,574 B2 | 7/2020 | Yilmaz |
| 2020/0099345 A1* | 3/2020 | Maalouf ............... H03F 1/0211 |
| 2020/0258988 A1 | 8/2020 | Molin et al. |

* cited by examiner

*Primary Examiner* — Metasebia T Retebo

(74) *Attorney, Agent, or Firm* — Jonathan J. Sapan

(57) ABSTRACT

A device having a reference transistor fabricated within the same semiconductor substrate as a primary transistor (e.g., configured for use in a radiofrequency amplifier or other active circuit) has a shared metallization area coupled to a current terminal of both transistors configured to shield a control terminal of the reference transistor from coupling of alternating current interference from alternating currents within the primary transistor.

18 Claims, 10 Drawing Sheets

TRANSISTOR CIRCUITS WITH SHIELDED REFERENCE TRANSISTORS

FIELD OF THE INVENTION

Embodiments of the subject matter described herein relate to transistor circuits with feedback systems for automatic bias adjustment.

BACKGROUND OF THE INVENTION

Transistor-based circuits such as amplifiers are often used for analog signal processing applications including amplification of radio and microwave-frequency (RFMW) signals. In some such applications, such as wireless communication systems, it may be important to ensure that power levels at the output of one or more amplification stages are sufficient to ensure suitable signal-to-noise ratios and/or that such power levels do not exceed a maximum power level (e.g., in order to protect other circuitry from damage, and/or to ensure that a wireless signal does not exceed safety or regulatory limits).

In RFMW transistor amplifiers and related transistor circuits, DC bias voltages are chosen to bias a transistor circuit at a desired operating point along an operating curve that relates a signal level at an input of the transistor circuit to a signal level at the output of the transistor circuit. An AC input signal applied in addition to a DC input bias produces a corresponding AC variation in the output of the transistor circuit which may be separated into a DC component and an AC component (i.e., an amplified copy of the AC input signal). Some transistor circuits include additional biasing circuitry to help ensure proper biasing to achieve desired performance characteristics.

SUMMARY OF THE INVENTION

In an example embodiment, a semiconductor device is provided. The semiconductor device includes a primary transistor formed within a semiconductor substrate and a reference transistor adjacent to the primary transistor formed within the semiconductor substrate. The primary transistor and the reference transistor each have a first current terminal, a second current terminal, and a control terminal.

The device includes a first gate metallization area of the semiconductor substrate that is electrically coupled to the control terminal of the primary transistor; a second gate metallization area of the semiconductor substrate that is electrically coupled to the control terminal of the reference transistor; and a shared metallization area of the semiconductor substrate that is coupled to both the first current terminal of the primary transistor and to the first current terminal of the reference transistor.

The shared metallization area includes a metallized extension that is disposed between the first gate metallization area and the second gate metallization area. The metallized extension is configured to shield the control terminal of the reference transistor from alternating-current signals applied to the current terminal of the primary transistor. The shared metallization area is also configured such that the first current terminal of the reference transistor is electrically coupled to the first current terminal of the primary transistor through the shared metallization area.

In or more embodiments, the device further includes a bias controller configured to operate the primary transistor at a desired operating point by applying predetermined bias voltages to the current terminals and the control terminal of the reference transistor; measuring a reference electrical current level flowing between the first current terminal and the second current terminal of the reference transistor; and applying bias voltages configured to operate the primary transistor at the desired operating point that are derived from the reference current level to the primary transistor.

In another example embodiment, a method of fabricating a semiconductor device is provided. The method includes forming a primary transistor and a reference transistor within a semiconductor substrate, each having a first current terminal, a second current terminal, and a control terminal. The reference transistor is formed adjacent to the primary transistor. The method also includes forming a first gate metallization area of the semiconductor substrate that is electrically coupled to the control terminal of the primary transistor; forming a second gate metallization area of the semiconductor substrate that is electrically coupled to the control terminal of the reference transistor; and forming a shared metallization area of the semiconductor substrate that is coupled to both the first current terminal of the primary transistor and to the first current terminal of the reference transistor.

Forming the shared metallization area includes forming a first metallized extension that is disposed between the first gate metallization area and the second gate metallization area. The first metallized extension is configured to shield the control terminal of the reference transistor from alternating-current signals applied to the current terminal of the primary transistor. The shared metallization area is also configured such that the first current terminal of the reference transistor is electrically coupled to the first current terminal of the primary transistor through the shared metallization area.

In or more embodiments, the method further includes coupling a bias controller to the reference transistor and the primary transistor. The bias controller is configured to operate the primary transistor at a desired operating point by applying predetermined bias voltages to the current terminals and the control terminal of the reference transistor; measuring a reference electrical current level flowing between the first current terminal and the second current terminal of the reference transistor; and applying bias voltages configured to operate the primary transistor at the desired operating point that are derived from the reference current level to the primary transistor.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein.

DETAILED DESCRIPTION

Figure 1:
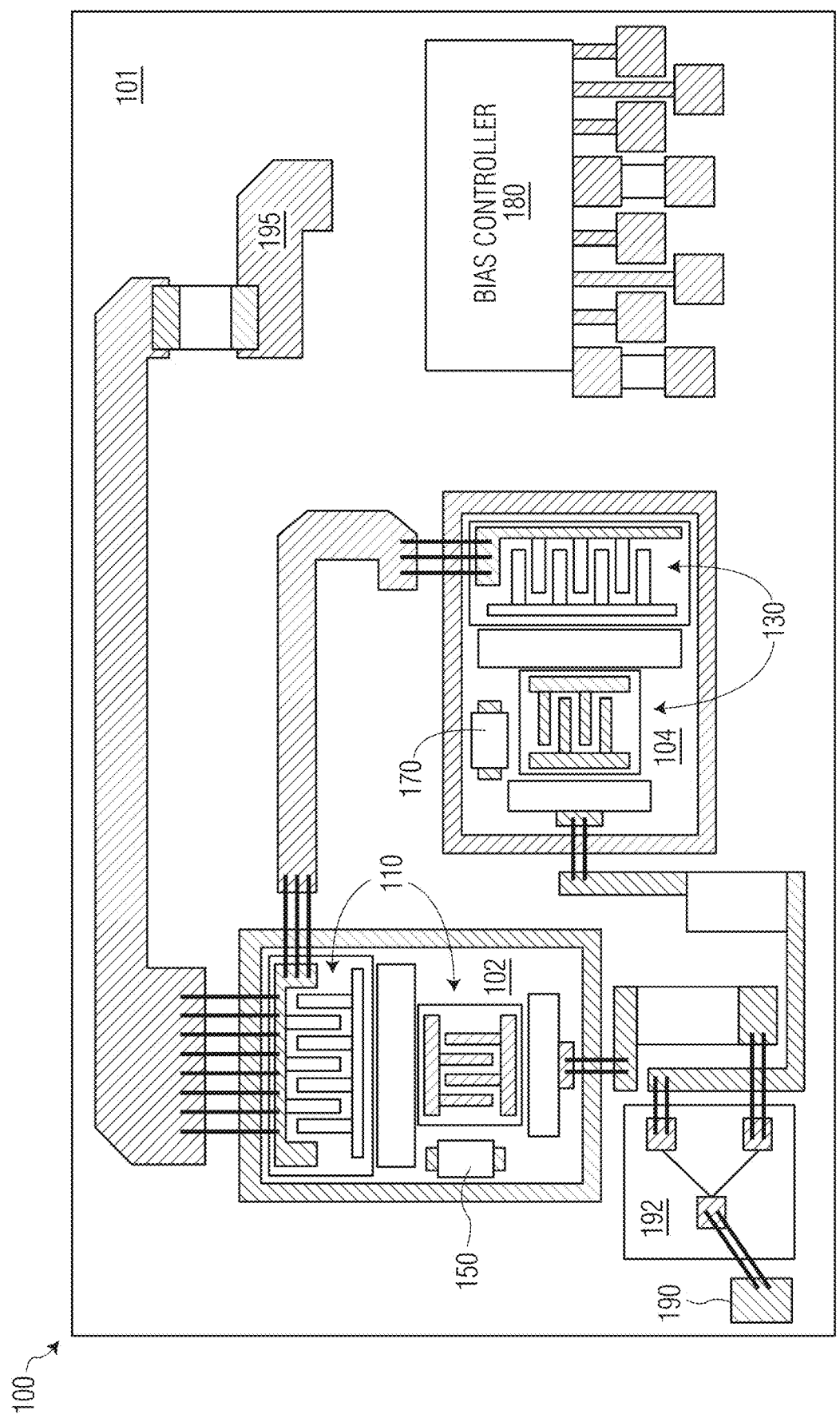
FIG. 1 is a plan-view schematic of an amplifier circuit including multiple semiconductor die and other components on a printed circuit board.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation, and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Conventional transistor circuits are often subject to variations that can make it difficult or impossible to ensure that they are always operated at a desired operating point along an input-output transfer function of such circuits (e.g., such that output signal levels of the transistor circuit remains within a desired output amplitude range). For instance, in a radiofrequency and microwave (RFMW) amplifier circuit, a desired operating point may coincide with a set of DC bias voltages supplied to the control terminal and current terminals of one or more transistors such that a particular range of RFMW input signal amplitudes results in an amplified RFMW signal at the output that remains within a specified range of desired output signal amplitudes or that other performance specifications such as noise levels or distortion levels are satisfied. Non-limiting examples of variations to which transistor-based circuits are susceptible include differences in performance characteristics between nominally identical individual transistors that arise from semiconductor processing variations. Such variations may occur between individual die or wafers and/or between individual device dies on a single die or wafer. Other non-limiting examples include performance variations that arise from temperature-dependent electrical transport phenomena, device "aging," and other factors. Accordingly, some transistor-based circuits include additional "reference transistors" which may be used to detect and correct for undesired performance variations in associated "active" or "primary" transistors.

As an example, FIG. 1 shows a simplified plan view of an amplifier device 100 in which reference transistors according to embodiments herein may be utilized. The example amplifier device 100 shown is a Doherty amplifier configuration in which two amplifier circuits, typically referred to as a "carrier amplifier" and a "peaking amplifier" are both coupled to the same alternating current (AC) input node 190 (via power splitter 192 and other circuitry that provides impedance matching) and the same output terminal 195 in order to provide consistent AC output performance across a wide range of AC signal levels at the input. It will be understood that embodiments herein may be discussed in the context of the example amplifier device 100 and other devices for purposes of illustration only and that nothing herein is intended to limit embodiments to use in any particular amplifier circuit or other electronic device.

As shown, the example amplifier device 100 is constructed on a carrier 101 (e.g., a polymer substrate such as a printed circuit board or other suitable carrier) that includes individual semiconductor die 102, 104 that are attached (e.g., soldered) to thermally- and electrically-conductive die pads in the carrier 101. Terminals of the semiconductor dies are wire-bonded to conductive traces on the carrier 101. In this example, a first semiconductor die 102 (e.g., a peaking amplifier of a Doherty amplifier) includes one or more primary transistors 110 (i.e., transistors configured for use as amplifier transistors or other active device requiring controlled biasing to operate the transistor at a desired operating point) and suitable metal traces (not shown) electrically coupling the primary transistor(s) 110 to bond pads (e.g., terminals), which are in turn electrically coupled to conductive traces on the carrier 101 by wire bonds. The example amplifier device 100 also includes a second semiconductor die 104 (e.g., a main or carrier amplifier of a Doherty amplifier) with one or more additional primary transistors 130 that are similarly coupled to conductive traces on the carrier 101 via wire bonds. The amplifier device includes an input port 190.

As shown, each semiconductor die 102, 104 includes a respective reference device (reference transistors 150,170 in this example). In general reference devices may be thermistors, diodes, transistors, or other devices which produce electrical signals that can be measured by a bias controller 180 and used to adjust the biasing of each of the amplifier transistors 110,130. For instance, if the reference devices are thermistors, the bias controller 180 may provide a constant voltage across each thermistor and measure a resulting current which will fluctuate with temperature. It is desirable to place reference devices close to the amplifier transistors 110,130 such that they can be expected to experience the same temperature changes as those transistors. For certain applications the use of reference devices such as the transistors 150,170 is desirable because the reference transistors 150,170 may formed from similar materials and by way of similar processing steps as the primary transistors 110,130 such that changes in the behavior of the reference transistors 150,170 may be used to infer changes in the behavior of the primary transistors 110,130. These inferences may be used to adjust the biasing of the transistors active 110,130 to ensure they are operated at or near their desired operating points under changing conditions.

Figure 2:
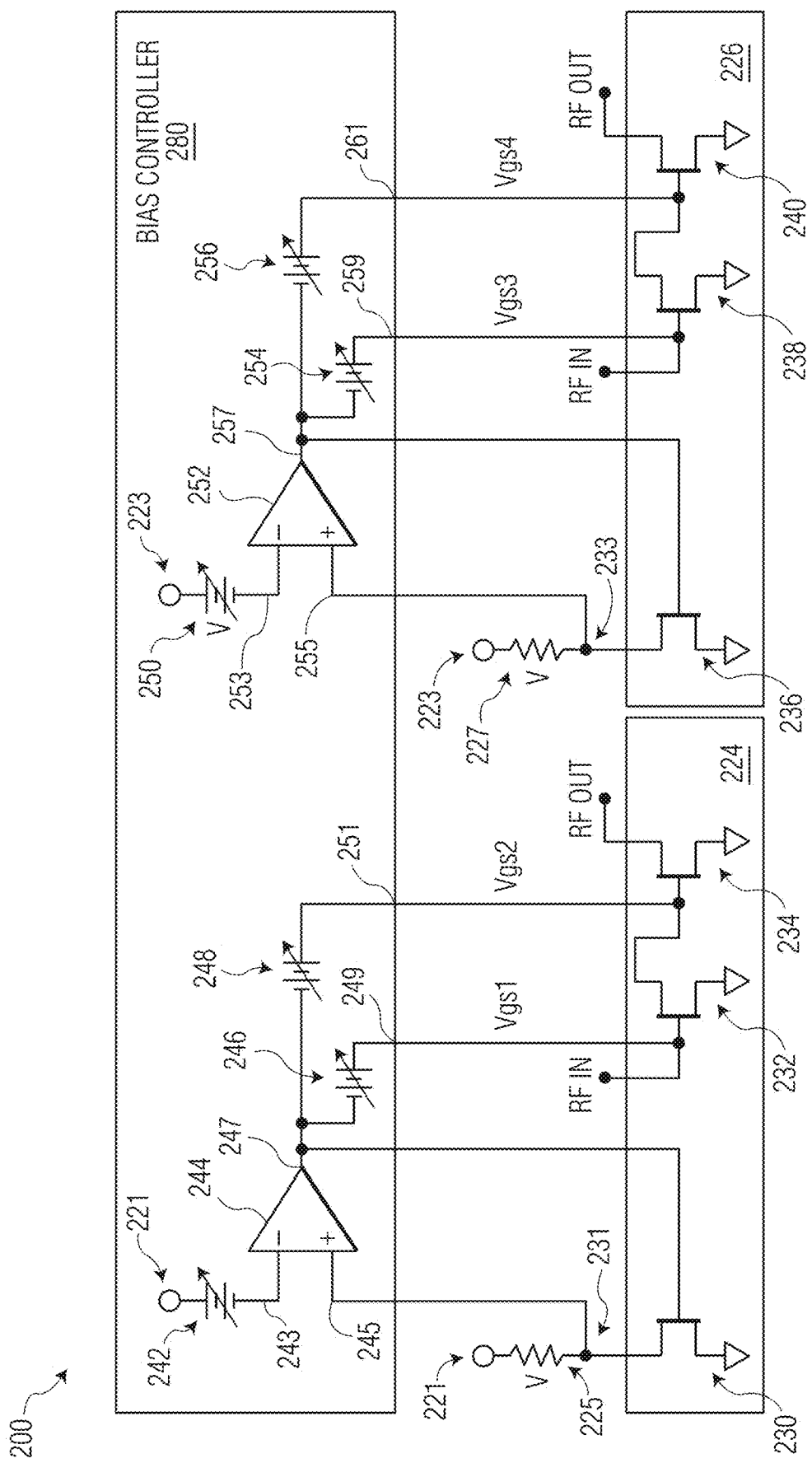
FIG. 2 is circuit diagram of an example amplifier system incorporating primary transistors and reference transistors according to one or more embodiments herein.

FIG. 2 is a circuit diagram of a portion of an example Doherty amplifier system 200 suitable for use with reference transistors according to embodiments herein. FIG. 2 shows internal components of and interconnections between a dual stage peaking amplifier 224 (e.g., embodied in the semiconductor die 102 of FIG. 1), a first high tolerance drain resistor 225, a dual stage carrier amplifier 226 (e.g., embodied in the semiconductor die 104 of FIG. 1), a second high tolerance drain resistor 227, and a bias controller 280 (e.g., the bias controller 180 of FIG. 1). As shown, the dual stage peaking amplifier 224 includes a first reference device 230 (e.g., the reference transistor 150), a first preliminary-stage amplifier transistor 232 (e.g., a first one of transistors 110, FIG. 1), and a second final-stage amplifier transistor 234 (e.g., a second one of transistors 110, FIG. 1), and the dual stage carrier amplifier 226 includes a second reference device 236 (e.g., the reference transistor 170), a third preliminary-stage amplifier transistor 238 (e.g., a first one of transistors 130, FIG. 1), and a fourth final-stage amplifier transistor 240 (e.g., a second one of transistors 130, FIG. 1).

A reference transistor such as the reference devices 230, 236 can be integrally formed on a single integrated circuit die with one or more primary transistors such as one or more of the transistors 232,234,238,240 so that these reference transistors are matched with the primary transistors on the same integrated circuit die. In other words, manufacturing variations affecting the reference transistors may be expected to similarly affect the adjacent primary transistors. Similarly, temperature variations and other environmental factors including "aging" may be expected to similarly affect both the reference transistor(s) and adjacent primary transistors on the same die. In one or more embodiments, a reference transistor has dimensions determined according to a scaled relationship with one or more primary transistors on the same integrated circuit die. For example, in the context of FIG. 2 the first reference device 230 and the first transistor 232 may be sized to have a ratio between about 1:30 and about 1:10, and the first reference device 230 and the second transistor 234 may be sized to have a ratio between about 1:20 and about 1:50, although the ratios could be higher or lower, as well.

As shown in FIG. 2, the bias controller 280 includes a first programmable voltage source 242, a first comparator circuit 244, a first programmable digital to analog converter (DAC 246), a second programmable DAC 248, a second programmable voltage source 250, a second comparator circuit 252, a third programmable DAC 254, and a fourth programmable DAC 256. The first high tolerance drain resistor 225 is electrically coupled between the DC voltage source 221 and a current-carrying terminal (e.g., the drain) of the first reference device 230, and the second high tolerance drain resistor 227 is electrically coupled between a DC voltage source 223 and a current-carrying terminal (e.g., the drain) of the second reference device 236. In some embodiments, the first high tolerance drain resistor 225 and the second high tolerance drain resistor 227 may be coupled to the respective drains of the first and second reference devices 230 and 236 through a connection to the bias controller 280.

A first (e.g., inverting) input 243 of the first comparator circuit 244 is electrically coupled to an output of the first programmable voltage source 242, a second (e.g., non-inverting) input 245 of the first comparator circuit 244 is electrically coupled to a current-carrying terminal (e.g., the drain) of the first reference device 230, and an output 247 of the first comparator circuit 244 is electrically coupled to the control input (e.g., the gate) of the first reference device 230 and respective inputs of each of the first and second programmable DACs 246 and 248. An output 249 of the first programmable DAC 46 is electrically coupled to the control input (e.g., the gate) of the first transistor 232, and an output 251 of the second programmable DAC 248 is electrically coupled to the control input (e.g., the gate) of the second transistor 234.

The first and second transistors 232, 234 are connected in a cascaded arrangement between the RF input (RF IN) and the RF output (RF OUT). More particularly, and as shown, the control terminal (e.g., the gate) of the first transistor 232 is electrically coupled to RF IN and one current-carrying terminal (e.g., the drain) of the first transistor 232 is electrically coupled to the control input (e.g., the gate) of the second transistor 234. A current-carrying terminal (e.g., the drain) of the second transistor 234 is electrically coupled to RF OUT (e.g., to the output terminal 195 of FIG. 1). The second current-carrying terminals (e.g., the sources) of the first and second transistors 232, 234 are shown being electrically connected to a ground reference.

As shown, the first (e.g., inverting) input 253 of the second comparator circuit 252 is electrically coupled to an output of the second programmable voltage source 250, a second (e.g., non-inverting) input 255 of the second comparator circuit 252 is electrically coupled to a current-carrying terminal (e.g., the drain) of the second reference device 236, and an output 257 of the second comparator circuit 252 is electrically coupled to the control input (e.g., the gate) of the second reference device 236 and respective inputs of each of the third and fourth programmable DACs 254 and 256. An output 259 of the third programmable DAC 254 is electrically coupled to the control input (e.g., the gate) of the third transistor 238, and an output 261 of the fourth programmable DAC 256 is electrically coupled to the control input (e.g., the gate) of the fourth transistor 240.

Similarly, the third and fourth transistors 238, 240 are connected in a cascaded arrangement between the RF input (RF IN, e.g., the input node 190 of FIG. 1) and the RF output (RF OUT, e.g., the output node 195 of FIG. 1). The control terminal (e.g., the gate) of the third transistor 238 is electrically coupled to RF IN and one current-carrying terminal (e.g., the drain) of the third transistor 238 is electrically coupled to the control input (e.g., the gate) of the fourth PA device 240. A current-carrying terminal (e.g., the drain) of the fourth transistor 240 is electrically coupled to RF OUT. The second current-carrying terminals (e.g., the sources) of the third and fourth transistors 238, 240 may be electrically connected to a ground reference. In this regard, it should be appreciated that, in the context of the embodiment of FIG. 2 (and FIG. 1) in which the Doherty amplifier system 200 employs the dual stage carrier amplifier 226 that includes the third and fourth transistors 238 and 240, the control input of the third transistor 238 is the node at which a RF input signal is received by the cascaded arrangement of transistors for amplification by those devices. Additionally, the drain of the fourth transistor 240 is the node at which an RF output signal is output by the cascaded arrangement of transistors, with the RF output signal being an amplified version of the RF input signal after being amplified by those transistors.

The components coupled to the peaking amplifier 224 operate as follows. The first programmable voltage source 242 is configured to provide a first reference voltage at the input 43 of the first comparator circuit 244. The first reference voltage may be set to a value representing a desired voltage drop from the DC voltage source 221 across the first high tolerance drain resistor 225 that is indicative of a desired constant current flow amount through both the first high tolerance drain resistor 225 and a conductive channel (e.g., drain-to-source channel) of the first reference device 230. In one example, the first reference voltage provided to the input 243 of the first comparator circuit 244 is approximately 2.8 volts, although the first reference voltage could be higher or lower, as well. The first comparator circuit 244 compares the first reference voltage to the voltage at a node 231 (e.g. the voltage drop across the first high tolerance drain resistor 225) and adjusts an output voltage at the output 247 to attain a first stabilized voltage, which is provided to the control terminal (e.g., gate) of the first reference device 230. The first stabilized voltage induces the first reference device 230, via the control input of the first reference device 230, to drive the voltage drop across the first high tolerance drain resistor 225 to equal the first reference voltage. As an example, the first stabilized voltage may be approximately 2 volts, although the first stabilized voltage could be higher or lower, as well.

Once the first comparator circuit 244 produces the first stabilized voltage, the first programmable DAC 246 is configured to offset the first stabilized voltage by a first offset voltage to produce a first control voltage applied to the control input of the first transistor 232. As an example, the first offset voltage may be approximately 0.1 volts, although the first offset voltage could be higher or lower. The first control voltage may be approximately 1.9 volts, although the first control voltage could be higher or lower, as well. Likewise, the second programmable DAC 248 is configured to offset the first stabilized voltage by a second offset voltage to produce a second control voltage applied to the control input of the second transistor 234. As an example, the second offset voltage may be approximately 0.9 volts, although the second offset voltage could be higher or lower. The second control voltage may approximately 1.3 volts, although the second control voltage could be higher or lower, as well.

In the example of FIG. 2, the components coupled to the carrier amplifier 226 operate in a substantially similar manner to the components coupled to the peaking amplifier 224 discussed above. In particular, the second programmable voltage source 250 is configured to provide a second reference voltage at the input 253 of the second comparator circuit 252. The second reference voltage may be set to a value representing a desired voltage drop from the DC voltage source 223 across the second high tolerance drain resistor 227 that is indicative of a desired constant current flow amount through both the second high tolerance drain resistor 227 and a conductive channel (e.g., drain-to-source channel) of the second reference device 236. As an example, the second reference voltage provided to input 253 of the second comparator circuit 52 may approximately 2.8 volts, although the second reference voltage could be higher or lower, as well. The second programmable voltage source 250 may be the same component as the first programmable voltage source 242 or a separate component. If these components are the same, the second reference voltage will be equivalent to the first reference voltage. Otherwise if the voltage sources 242, 250 are distinct components, the first and second reference voltages could be equivalent or different from each other.

The second comparator circuit 252 compares the second reference voltage to the voltage at a node 233 (e.g., the voltage drop across the second high tolerance drain resistor 227), and adjusts an output voltage at the output 257 to attain a second stabilized voltage, which is provided to the control terminal (e.g., gate) of the second reference device 236. The second stabilized voltage induces the second reference device 236, via the control input of the second reference device 236, to drive the voltage drop across the second high tolerance drain resistor 227 to equal the second reference voltage. As an example, the second stabilized voltage may be approximately 2 volts, although the second stabilized voltage could be higher or lower, as well. After the second comparator circuit 252 produces the second stabilized voltage, the third programmable DAC 254 is configured to offset the second stabilized voltage by a third offset voltage to produce a third control voltage applied to the control input of the third transistor 238. As an example, the third offset voltage may be approximately 0.1 volts, although the third offset voltage could be higher or lower. As an example, the third control voltage is approximately 1.9 volts, although the third control voltage could be higher or lower, as well. Likewise, the fourth programmable DAC 256 is configured to offset the second stabilized voltage by a fourth offset voltage to provide a fourth control voltage applied to the control input of the fourth transistor 224. In some embodiments, the fourth offset voltage can be approximately 0.1 volts, although the fourth offset voltage could be higher or lower. As an example, the fourth control voltage maybe approximately 1.8 volts, although the fourth control voltage could be higher or lower, as well. The third programmable DAC 254 and the fourth programmable DAC 256 offset the second stabilized voltage to drive the third and fourth transistors 236 and 238. The first offset voltage and the third offset voltage can be preconfigured by adjusting control inputs of the first and second programmable DACs 256 and 254 to drive the third and fourth transistors 236 and 238 to operate along desired portions of their operating curves.

The third programmable DAC 254 and the fourth programmable DAC 256 may be configured to apply the third and fourth control voltages to the respective control inputs of the third transistor 238 and the fourth transistor 220 when a transceiver coupled to the amplifier device 200 is in a transmit state. The third control voltage provides a third bias (e.g., DC bias) voltage for a third RF signal applied to the control input (labeled "RF IN") of the third transistor 238 and the fourth control voltage provides a fourth bias (e.g., DC bias) voltage for a fourth RF signal applied to the control input of the fourth transistor 240. In the dual amplifier configuration of FIG. 2, the fourth RF signal is the output signal from the drain of the third transistor 238. The third and fourth bias voltages increase the DC voltage level(s) (DC component(s)) of the third and fourth RF signals, respectively, to level(s) that will induce the third and fourth transistors 238 and 240 to operate in their respective "active" (or "linear" regions) of their operating curves. When operating in these active regions, the third and fourth transistors 238, 240 operate to amplify the respective RF signals applied to the respective control inputs of the third and fourth transistors 238 and 240. In some embodiments, the third and fourth bias voltages can bias the third and fourth transistors 238, 240 to operate within desired output power ranges.

Thus, as illustrated above, the use of reference transistors can be desirable to ensure stable operation of transistor-based circuits, including amplifier devices such as those described above in connection with FIG. 1 and FIG. 2, and related circuits, as non-limiting examples. In such applications, it can be desirable for reference transistors be placed as close possible to associated primary transistors (e.g., primary transistors 110/130) on the same substrate (e.g., the same semiconductor die) in order to reduce manufacturing costs (by reducing the physical die size required to accommodate an primary transistor and a corresponding reference transistor) and/or to ensure that the conditions experienced by the primary transistor(s) are as close as possible to those experienced by the accompanying reference transistor(s). However, undesired effects may occur when reference transistors are placed in close proximity to primary transistors on a die, as may be understood with reference to FIG. 3.

Figure 3:
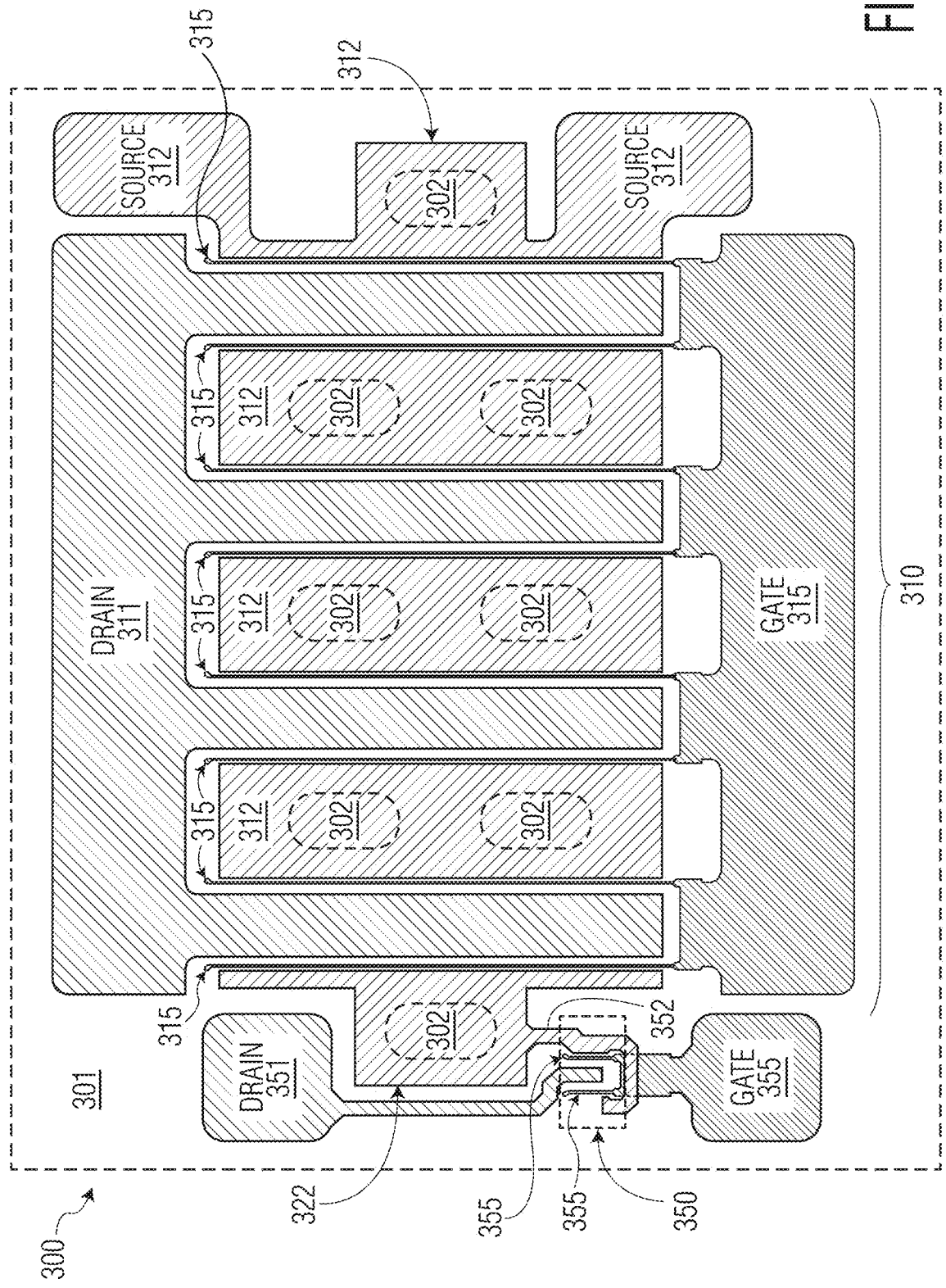
FIG. 3 shows a plan-view schematic of power transistor and an accompanying reference transistor.

FIG. 3 is a plan view depicting the top surface 301 of a device substate (e.g., a semiconductor die) of an example device 300 that includes a primary transistor 310 and a reference transistor 350. In the example of FIG. 3, the primary transistor 310 is a power transistor that has an input/control terminal (represented by a gate metallization area 315, which may be a first bond pad) coupled to elongated gate structures of the primary transistor 310, an output terminal (represented by a drain metallization area 311, which may be a second bond pad) coupled to elongated drain contacts of the primary transistor 310, and a source metallization area 312 coupled to elongated source contacts of the primary transistor 310 and to source vias 302, which extend through the semiconductor substrate to provide a ground reference. The elongated gate structures, drain contacts, and source contacts are interdigitated. The reference transistor 350 has a drain metallization area 351, which may be a third bond pad, coupled to a drain contact or other equivalent current terminal of the transistor 350, and a gate metallization area 355, which may be a fourth bond pad, coupled to gate structure(s) of the reference transistor 350. As shown the other current terminal of the reference transistor 350 (e.g., a source contact) is electrically coupled to a shared metallization area 322 that is coupled to the source metallization area 312 (and thus to a source or other equivalent current terminal) of the primary transistor 310 and to the source (or any other suitable current terminal) of the reference transistor 350. These various electrodes may be formed by metallized (or otherwise electrically conductive) areas on the surface 301 forming contact pads, electrical traces, and/or bond pads, as non-limiting examples. As shown, the shared metallization area 322 and the source metallization area 312 are each coupled to one or more conductive vias 302 which may be electrically coupled to a reference voltage node on the bottom surface of the substrate in which the device 300 is formed (not explicitly shown in FIG. 3) such as a conductive layer on the bottom surface of the substrate 301, which can in turn to be coupled to reference voltage supply connection.

While placement of a reference transistor on the same die as a primary transistor as shown in FIG. 3 is often desirable, the arrangement of the transistors 310, 350 shown in FIG. 3 and similar arrangements can have disadvantages. For instance, although the combined area required for the transistors 310, 350 may be optimized, the proximity of the gate metallization area 355 of the reference transistor 350 to the gate metallization area 315 of the primary transistor 310 may result in undesirable capacitive coupling of signals applied to the control terminal of the primary transistor 310 to the control terminal of the reference transistor 350. For example, if the primary transistor 310 is configured for use in an alternating current (AC) amplifier, AC signals may be applied to the gate metallization area 315 as input signals. When the primary transistor 310 is properly biased, small time-varying changes in the bias applied to the gate metallization area 315 may be amplified at the drain metallization area 311 of the primary transistor 310. Meanwhile, the reference transistor 350 may be biased by direct-current (DC) voltage or current signals applied to the gate metallization area 355. The output of the reference transistor 350 coupled to the drain metallization area 351 may form the input to bias control circuitry (e.g., the bias control circuitry 180) used to bias the primary transistor 310 at its desired operating point(s). However, if AC signals applied to the gate metallization area 315 are electromagnetically and/or capacitively coupled to the gate metallization area 355, an additional AC signal may be unintentionally applied to the gate metallization area 355 of the reference transistor 350. Such undesired application of AC signals to the gate metallization area 355 can in turn result in undesired fluctuations in biasing voltages or currents applied to the primary transistor 310 when the reference transistor 350 is used as described in connection with FIG. 2 or in related applications in which measurement of a current or voltage signal produced by the reference transistor 350 is used to ensure correct biasing of the primary transistor 310.

Figure 4A:
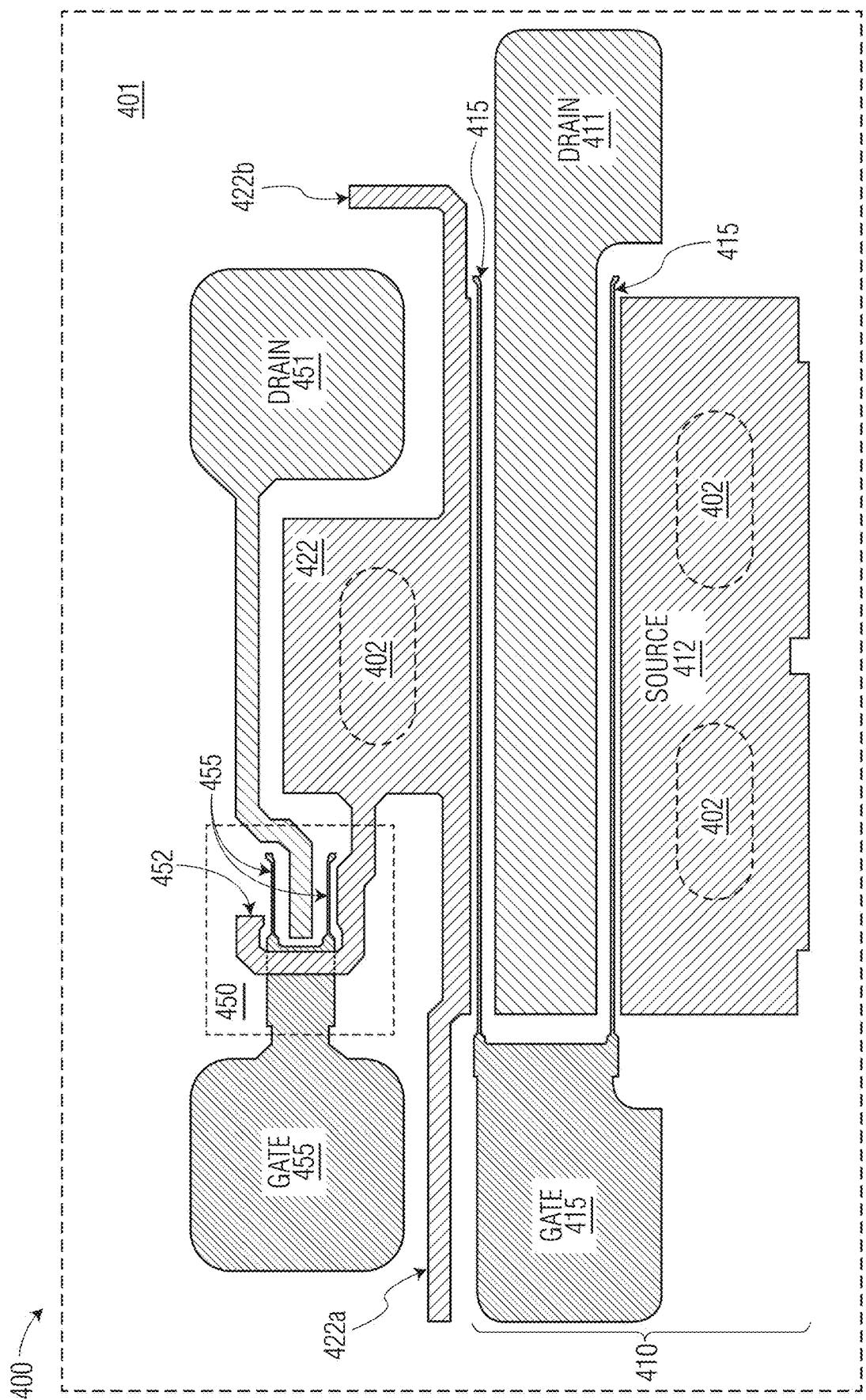
FIG. 4A shows a plan-view schematic of a portion of a semiconductor die that includes a power transistor and an accompanying reference transistor that is shielded from interference from the power transistor according to one or more embodiments herein.
Figure 4B:
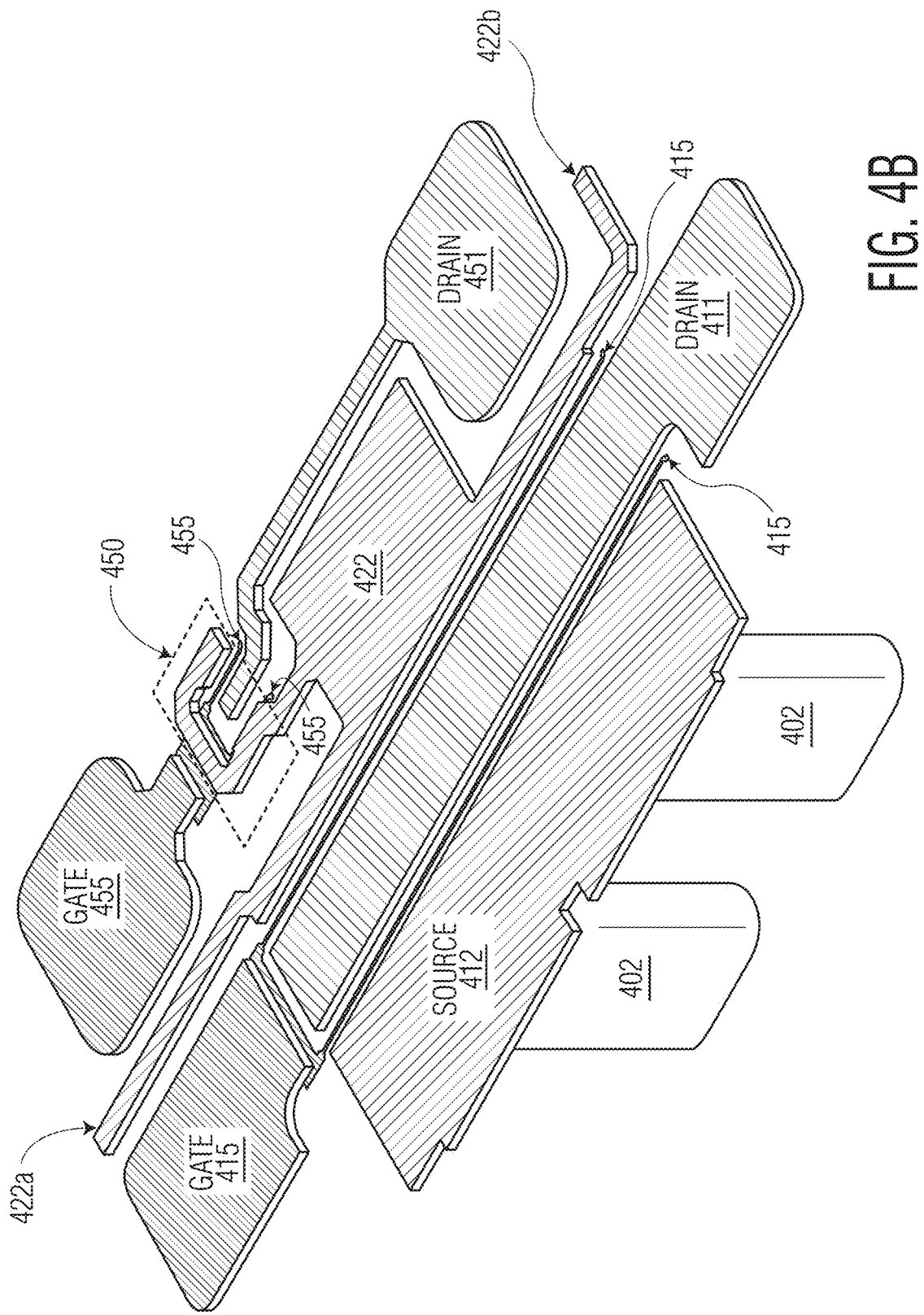
FIG. 4B shows a perspective view of elements of the transistors of FIG. 4A.

Accordingly, FIG. 4A and FIG. 4B illustrate features of devices and methods to address such shortcomings according to embodiments herein, as may be understood with reference to a portion of an example device 400 that includes a primary transistor 410 and a reference transistor 450 integrally formed within a single semiconductor die. FIG. 4A shows a plan view of the portion of the example device 400 where it can be seen that the primary transistor 410 (only a portion of which is shown) and the reference transistor 450 are both coupled (via the source terminal or other equivalent terminal of each transistor) to a shared metallization area 422 with extensions 422a and 422b. As shown in this example, the shared metallization area 422 is electrically coupled both to the source terminal of the primary transistor 410 (represented by the source metallization area 412) and of the reference transistor 450 (represented by the source metallization area 452) such that the sources (or other equivalent current terminals) of the two transistors are coupled to the same reference voltage node (e.g., a ground plane or substrate connection). In the example device 400, the shared metallization area 422 and the source metallization area 412 of the primary transistor 410 both are coupled to a reference voltage connection (e.g., a conductive layer, not shown, on or near the bottom surface of the device 400 which may be connected to a reference voltage supply) by way of conductive vias 402, one of which is shown in FIG. 4A. FIG. 4B is a perspective view of the device 400 in FIG. 4A in which only the metallization areas of the device 400 and the conductive vias 402 are visible.

As can be seen in FIG. 4A and FIG. 4B, the shared metallization area 422 has an extension 422a that is disposed between the gate metallization area 415 of the primary transistor 410 (e.g., an electrode coupled to a control terminal/gate structure of the primary transistor 410) and the gate metallization area 455 of the reference transistor 450 (e.g., an electrode coupled to a control terminal/gate structure of the reference transistor 450). As shown, the shared metallization area 422 also has an extension 422b that extends between a drain metallization area 411 of the primary transistor 410 (e.g., an electrode coupled to a drain contact or other current terminal of the primary transistor 410) and the drain metallization area 451 of the reference transistor 450 (e.g., an electrode coupled to a drain contact or other current terminal of the reference transistor 450). When the source (or other equivalent current terminal) of the primary transistor 410 and the source (or other equivalent current terminal) of the reference transistor are coupled together and grounded (e.g., through vias 402), each of the extensions 422a and 422b of the shared metallization area, which also are coupled to the source terminals and thus to ground, can act as a ground shield that reduces undesired electromagnetic and/or capacitive coupling of AC signals applied to the primary transistor to terminals of the reference transistor 450. As a result, when the reference transistor 450 is used as an input to bias circuitry for the primary transistor 410 (e.g., to biasing circuitry 180/280), for example, the output of the reference transistor 450 may be made more resistant to undesired fluctuations. This increased resistance to undesired fluctuation in the output of the reference transistor 450 can result in increased biasing stability of the primary transistor 410 at a desired operating point.

Figure 5A:
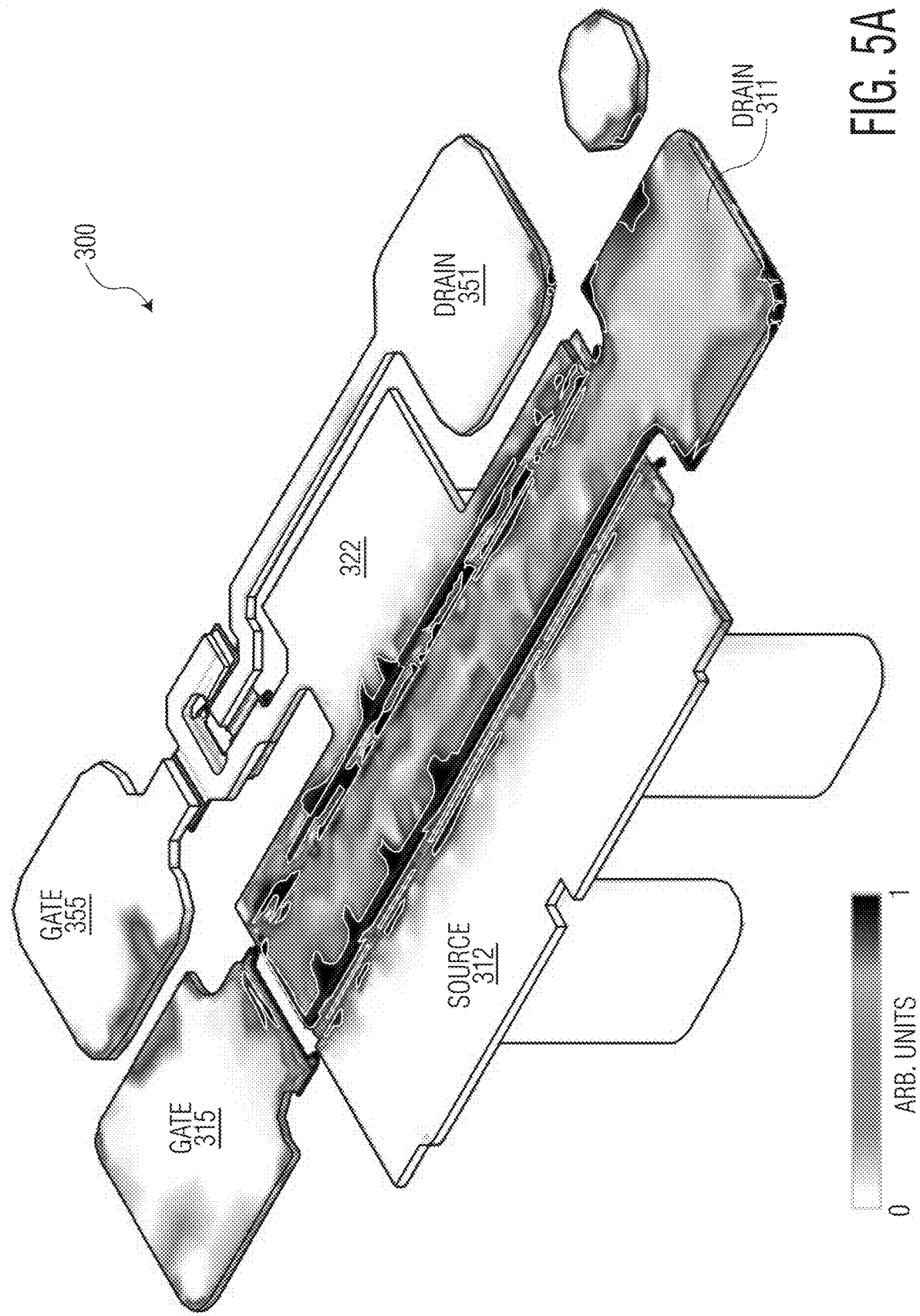
FIG. 5A is an illustration depicting coupling of AC electric fields from the gate metallization of the primary transistor of FIG. 3 to the accompanying reference transistor.

FIG. 5A is an illustration depicting a simulated electric field distribution in the metallization areas of the device 300 of FIG. 3 under realistic small-signal conditions. Specifically, performance of the device was simulated for a drain-source potential difference ($V_{DS}$) equal to 48V and a gate-source potential difference ($V_{GS}$) of approximately −2.5V, with an input signal frequency of 3.5 GHz having an input power less than −20 dBmW.

Figure 5B:
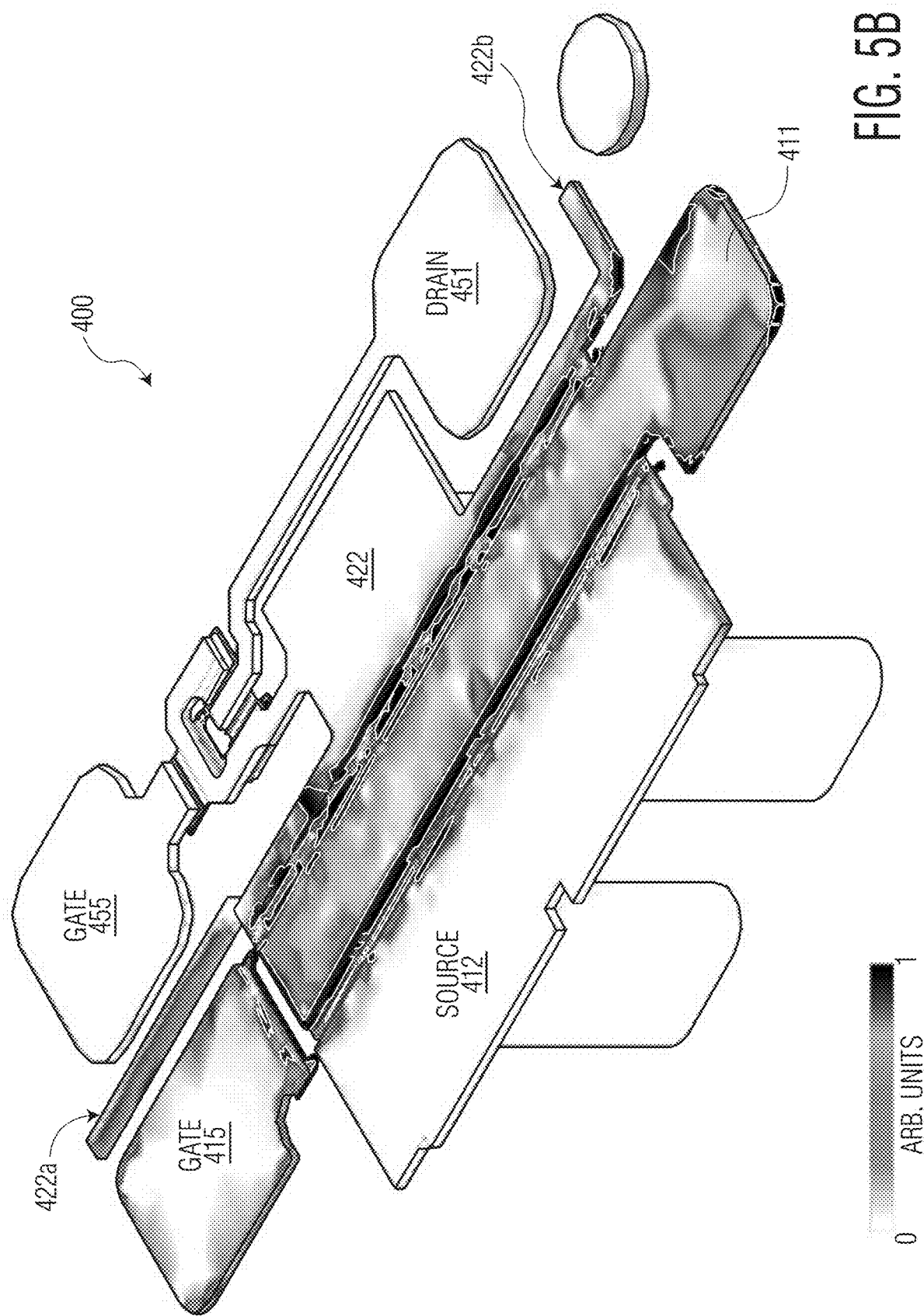
FIG. 5B is an illustration depicting coupling of AC electric fields from the gate metallization of the primary transistor to the reference transistor in the embodiment of FIG. 4A and FIG. 4B.

As shown in FIG. 5A, there may be coupling of electric fields from the gate metallization area 315 of the primary transistor 310 to the gate metallization area 355 of the reference transistor 350 when operating under certain conditions; in one or more applications it may be desirable to reduce such coupling. Along these lines, FIG. 5B is a similar illustration of simulated electric fields in the example device 400 in which the reference transistor 450 is shielded with a metallization extension 422a, as described above in connection with FIG. 4. Specifically, it will be appreciated that the presence of the extension 422a of the shared metallization area between the gate metallization area 415 and the gate metallization area 455 may result in no appreciable electromagnetic or capacitive coupling of signals applied to the control terminal of the primary transistor 410 via the gate metallization area 415 to the control terminal of the reference transistor 450 via the gate metallization area 455. Similarly the extension 422b of the shared metallization area 422 can be seen to significantly reduce the electromagnetic or capacitive coupling of voltage signals between the drain metallization area 411 of the primary transistor 410 and the drain metallization area 451 of the reference transistor 450, compared to the coupling of signals from the between the drain metallization area 311 of the primary transistor 310 and the drain metallization area 351 of the reference transistor 350, as shown in FIG. 5A.

Figure 6:
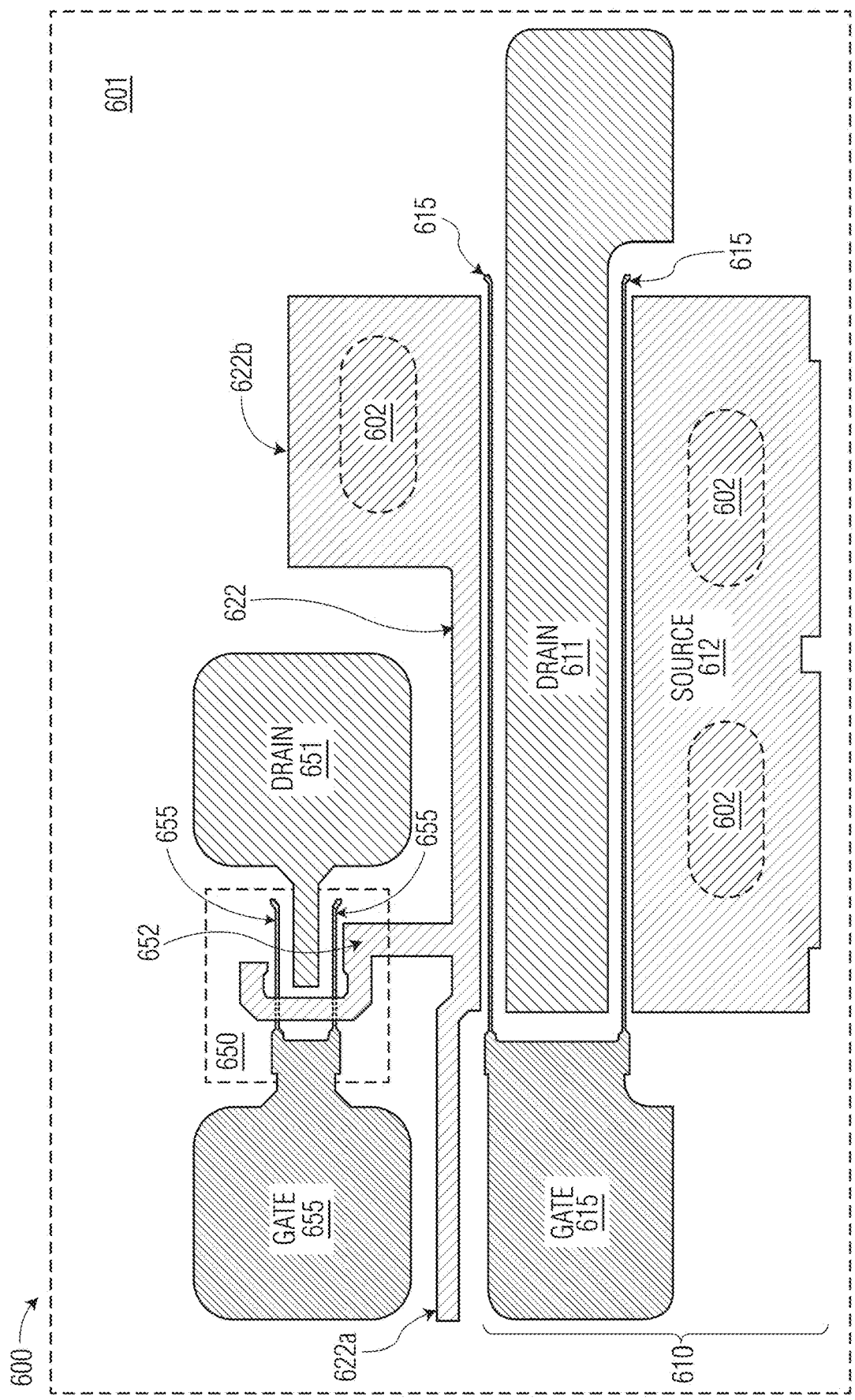
FIG. 6 shows a plan-view schematic of a portion of a semiconductor die that includes a power transistor and an accompanying reference transistor that is shielded from interference from the power transistor according to one or more embodiments related to the embodiment(s) of FIG. 4A and FIG. 4B.

It will be understood that in one or more embodiments, the positioning and dimensions of elements shown and described above may be adjusted to suit different applications and to provide different degrees of shielding a reference transistor such as the reference transistor 450. For example, FIG. 6 shows a portion of an example device 600 with a primary transistor 610 and a reference transistor 650 having substantially similar characteristics to the primary transistor 410 and the reference transistor 450 of FIGS. 4A and 4B. In addition, device 600 includes a shared metallization area 622, a first extension 622a between the respective gate metallization areas 615, 655 of the transistors 610, 650 and a second metallized extension 622b between the respective drain metallization areas 611, 651 of the transistors 610, 650. The shared metallization area 622 and the extensions 622a, 622b are coupled to vias 602, which in turn may be coupled to a ground reference, as described previously. However, in the device 600, the position of the drain metallization area 651 reference transistor 650 is shifted to the left and the position of the portion of the shared metallization area 622 on the semiconductor substrate 601 (e.g., the shared metallization area 422 on the substrate 401) that is coupled to an underlying via 602 (e.g., a via 402) is shifted to the right compared to the device 400 as depicted in FIG. 4 for a more compact layout. In this arrangement, a large portion of the shared metallization area 622 disposed above a via 602 forms an extension of the shared metallization area between the respective drain metallization areas 611, 651 of the transistors 610, 650. Thus, the extension 622b of the shared metallization area 622 between the drain metallization area 651 and the drain metallization area 611 is significantly larger than the corresponding extension 422b of the shared metallization area 422 of FIG. 4, resulting in increased shielding of the drain metallization area 651 of the reference transistor 650 compared to shielding of the drain metallization area 451 of the reference transistor 450.

Figure 7:
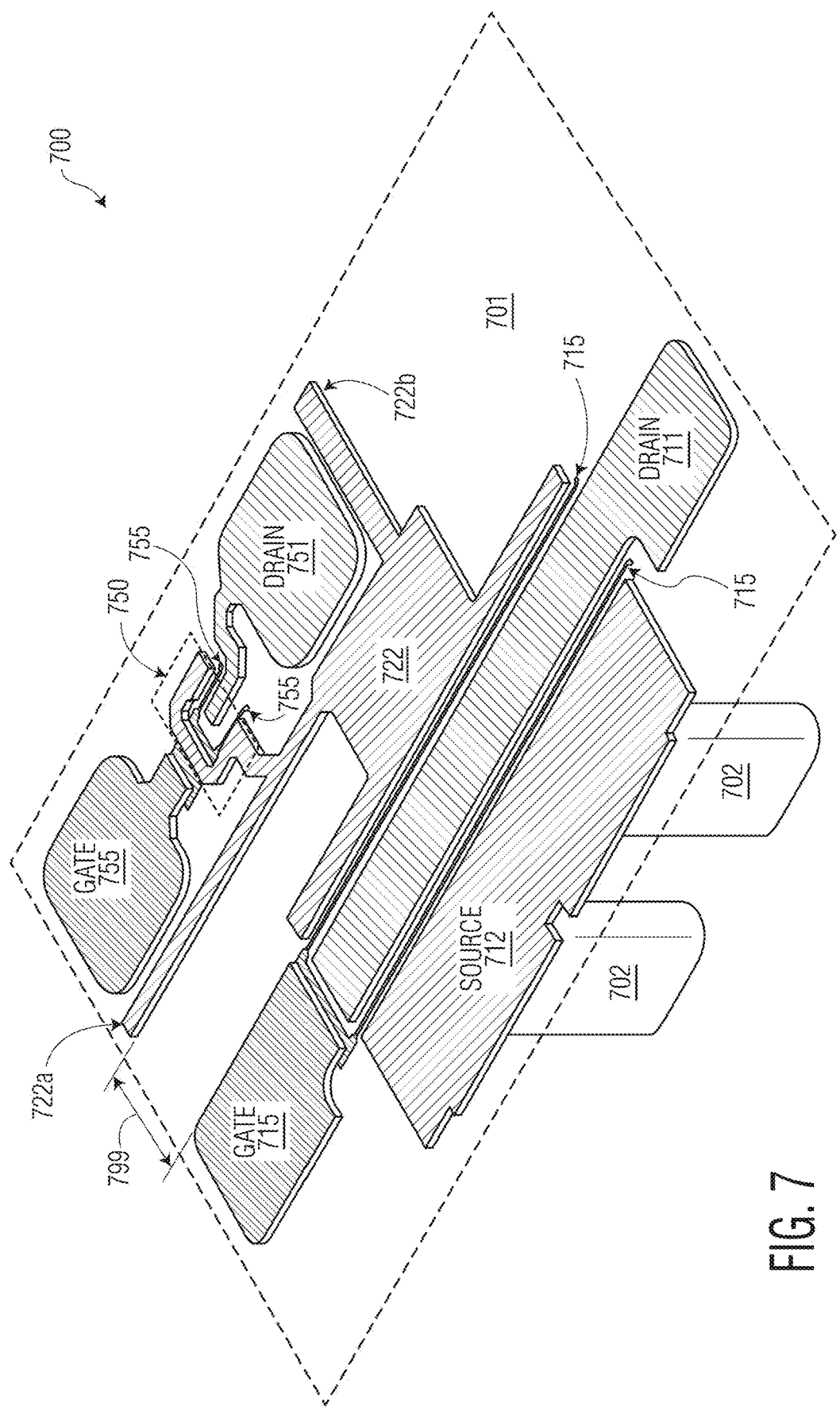
FIG. 7 shows a perspective view of elements of a power transistor and an accompanying reference transistor that is shielded from interference from the power transistor according to one or more embodiments related to the embodiments of FIG. 4A and FIG. 4B.

As a further example, FIG. 7 shows a portion of an example device 700 with a primary transistor 710 and reference transistor 750. In this example, the positioning and shape of the drain metallization area 751 has been adjusted. In addition, the extension 722a of the shared metallization area 722 between the gate metallization area 715 of the primary transistor 710 (e.g., a gate metallization area 415/615) and the gate metallization area 755 of the reference transistor 750 (e.g., a gate metallization area 455/655) is elongated and spaced apart from the edge of the gate metallization area 715 nearest the gate metallization area 755 by a distance 799. In one or more embodiments, a portion of the shared metallization area such as the extension 722a of the shared metallization area 722 is positioned and dimensioned to provide a minimum distance (e.g., the distance 799) between the edge of the gate metallization area of the primary transistor (e.g., the gate metallization area 715) and the portion of the shared metallization area closest to the gate metallization area of a reference transistor (e.g., the extension 722a of the shared metallization area 722) and in turn closest to the gate metallization of the reference transistor (e.g., the gate metallization area 715). In or more embodiments, this distance may be in an inclusive range between 10-50 μm, or any other suitable range.

Figure 8:
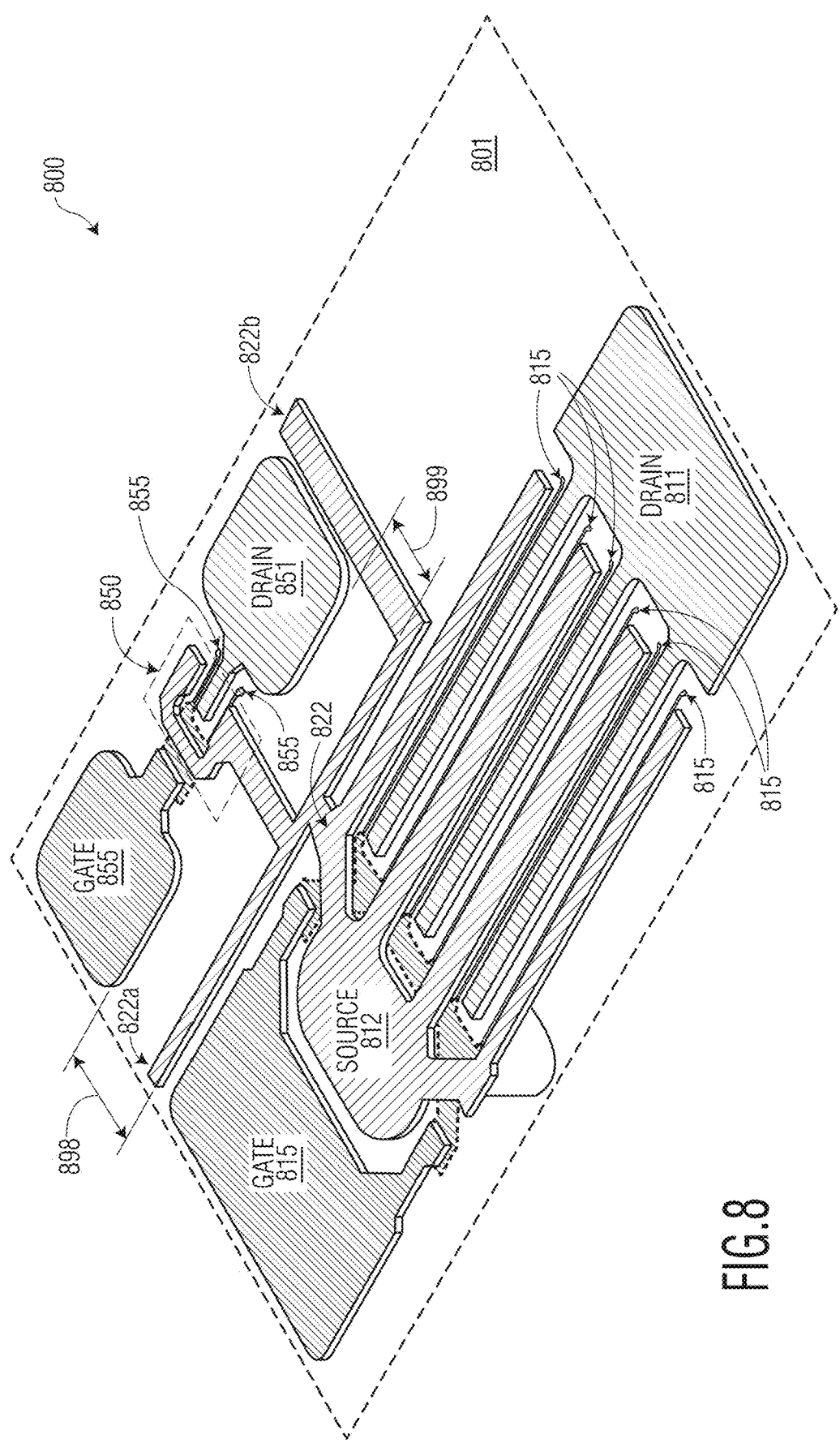
FIG. 8 shows a perspective view of elements of a power transistor and an accompanying reference transistor that is shielded from interference from the power transistor according to one or more embodiments related to the embodiments of FIG. 4A, FIG. 4B, FIG. 6, and FIG. 7.

Embodiments herein may also be practiced using any suitable transistor geometries, as may be appreciated from the example device 800 of FIG. 8 having a primary transistor 810 and a reference transistor 850. As shown the, the primary transistor 810 may be a high-power transistor with multiple interdigitated source and drain fingers (i.e., the drain metallization area 811 and source metallization area 812) that has a shared metallization area 822 coupled to both the source (or other suitable current terminal) of the primary transistor 810 and to the source (or other suitable current terminal) of the reference transistor 850. Similarly to the common metallization area 722 of the device 700, the shared metallization area 822 of the device 800 has an extension 822a that extends in a first direction between the gate metallization area 815 of the transistor 810 and the gate metallization area 855 of the reference transistor 850. The shared metallization area 822 also includes a second metallized extension 822b that extends in a second direction that is at least partially orthogonal to the first direction, and that is disposed between the drain metallization area 851 of the reference transistor 850 and the drain metallization area 811 of the primary transistor 810. In the example device 800 the gate metallization area 815 and the gate metallization area 855 are configured and arranged to ensure a minimum distance 898 between the two gate metallization areas. In the example device 800, the shared metallization area 822 and the drain metallization area 851 of the reference transistor 850 are configured to ensure at least a gap 899 between the edge of the drain metallization area 851 and an adjacent edge of the shared metallization area 822 as shown.

It will be understood that nothing in the foregoing examples is intended to limit the geometry of devices according to embodiments herein and that the device geometries shown are non-limiting examples of suitable arrangements of a primary transistor and a shielded reference transistor with source terminals (or any other equivalent current terminals) coupled to a common reference voltage node including, but not limiting to a ground plane buried within a semiconductor substrate.

Features of embodiments may be understood by way of one or more of the following examples:

Example 1: A semiconductor device that includes a primary transistor formed within a semiconductor substrate and a reference transistor adjacent to the primary transistor formed within the semiconductor substrate. The primary transistor and the reference transistor each have a first current terminal, a second current terminal, and a control terminal. The device includes a first gate metallization area of the semiconductor substrate that is electrically coupled to the control terminal of the primary transistor; a second gate metallization area of the semiconductor substrate that is electrically coupled to the control terminal of the reference transistor; and a shared metallization area of the semiconductor substrate that is coupled to both the first current terminal of the primary transistor and to the first current terminal of the reference transistor. The shared metallization area includes a metallized extension that is disposed between the first gate metallization area and the second gate metallization area. The metallized extension is configured to shield the control terminal of the reference transistor from alternating-current signals applied to the current terminal of the primary transistor. The shared metallization area is also configured such that the first current terminal of the reference transistor is electrically coupled to the first current terminal of the primary transistor through the shared metallization area.

Example 2: The device of Example 1 further including a bias controller configured to operate the primary transistor at a desired operating point by applying predetermined bias voltages to the current terminals and the control terminal of the reference transistor; measuring a reference electrical current level flowing between the first current terminal and the second current terminal of the reference transistor; and applying bias voltages configured to operate the primary transistor at the desired operating point that are derived from the reference current level to the primary transistor.

Example 3: The device of any of Example 1 or Example 2, in which the shared metallization area further includes a second metallized extension that is disposed between a first drain metallization area of the semiconductor substrate that is electrically coupled to the second current terminal of the primary transistor and a second drain metallization area of the semiconductor substrate electrically coupled to the second current terminal of the reference transistor.

Example 4: The device of any of Examples 1-3, in which the primary transistor is formed within a first portion of the semiconductor substrate and the reference transistor is formed within a second portion of the semiconductor substrate; and the first portion of the semiconductor substrate and the second portion of the semiconductor substrate are disposed on opposite sides of the common metalized area.

Example 5: The device of any of Examples 1-4, in which the first gate metallization area is separated from the second gate metallization area by a first metallized extension of the shared metallization area that is spaced apart from both the first gate metallization area and the second gate metallization area.

Example 6: The device of any of Examples 1-5, in which the first metallized extension of the shared metallization area extends in a first direction and is disposed between the first gate metallization area and the second gate metallization area.

Example 7: The device of any of Examples 1-6, in which a second metallized extension of the shared metallization area extends in a second direction that is at least partially orthogonal to the first direction. The second metallized extension of the shared metallization area is disposed between a first drain metallization area electrically coupled to the second current terminal of the primary transistor and a second drain metallization area electrically coupled to the second current terminal of the reference transistor. The second metallized extension of the shared metallization area is spaced apart from both the first drain metallization area and the second drain metallization area.

Example 8: The device of any of Examples 1-7, in which the shared metallization area is electrically coupled to a reference voltage node of the semiconductor substrate by one or more electrically conductive vias within the semiconductor substrate.

Example 9: The device of any of Examples 1-8, in which an edge of the first gate metallization area closest to the second gate metallization area is separated from the second gate metallization area by a distance in an inclusive range between 10 μm and 50 μm.

Example 10: The device of any of Examples 1-9 that further includes a set of two or more electrically conductive source electrode fingers of the primary transistor that are coupled to the shared metallization area; a set of two or more electrically conductive drain electrode fingers of the primary transistor in an interdigitated arrangement with the source electrode fingers; and a set of two or more electrically conductive gate metallization area fingers of the primary transistor that are disposed in an interdigitated arrangement with the source electrode fingers and the drain electrode fingers.

Example 11: The device of any of Examples 1-10, in which the first gate metallization area, the second gate metallization area, and the shared metallization area are formed from a single layer of conductive material on the surface of the semiconductor substrate.

Example 12: A method of forming a semiconductor device that includes forming a primary transistor and a reference transistor within a semiconductor substrate, each having a first current terminal, a second current terminal, and a control terminal. The reference transistor is formed adjacent to the primary transistor. The method also includes forming a first gate metallization area of the semiconductor substrate that is electrically coupled to the control terminal of the primary transistor; forming a second gate metallization area of the semiconductor substrate that is electrically coupled to the control terminal of the reference transistor; and forming a shared metallization area of the semiconductor substrate that is coupled to both the first current terminal of the primary transistor and to the first current terminal of the reference transistor.

Forming the shared metallization area includes forming a first metallized extension that is disposed between the first gate metallization area and the second gate metallization area. The first metallized extension is configured to shield the control terminal of the reference transistor from alternating-current signals applied to the current terminal of the primary transistor. The shared metallization area is also configured such that the first current terminal of the reference transistor is electrically coupled to the first current terminal of the primary transistor through the shared metallization area.

Example 13: The method of Example 12, in which the shared metallization area further includes a second metallized extension that is disposed between a first drain metallization area of the semiconductor substrate that is electrically coupled to the second current terminal of the primary transistor and a second drain metallization area of the semiconductor substrate electrically coupled to the second current terminal of the reference transistor.

Example 14: The method of any of Examples 12 or Example 13, in which the primary transistor is formed within a first portion of the semiconductor substrate and the reference transistor is formed within a second portion of the semiconductor substrate; and the first portion of the semiconductor substrate and the second portion of the semiconductor substrate are disposed on opposite sides of the common metalized area.

Example 15. The method of any of Examples 12-14, in which the first gate metallization area is separated from the second gate metallization area by a first metallized extension of the shared metallization area that is spaced apart from both the first gate metallization area and the second gate metallization area.

Example 16. The method of any of Examples 12-15, in which the first metallized extension of the shared metallization area extends in a first direction and is disposed between the first gate metallization area and the second gate metallization area.

Example 17. The method of any of Examples 12-16, further including forming a second metallized extension of the shared metallization area extends in a second direction that is at least partially orthogonal to the first direction. The second metallized extension of the shared metallization area is disposed between a first drain metallization area electrically coupled to the second current terminal of the primary transistor and a second drain metallization area electrically coupled to the second current terminal of the reference transistor. The second metallized extension of the shared metallization area is spaced apart from both the first drain metallization area and the second drain metallization area.

Example 18. The method of any of Examples 12-17, further including forming a set of two or more electrically conductive source electrode fingers of the primary transistor that are coupled to the shared metallization area; forming a set of two or more electrically conductive drain electrode fingers of the primary transistor in an interdigitated arrangement with the source electrode fingers; and forming a set of two or more electrically conductive gate metallization area fingers of the primary transistor that are disposed in an interdigitated arrangement with the source electrode fingers and the drain electrode fingers.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A semiconductor device, comprising:
a primary transistor formed within a semiconductor substrate, the primary transistor having a first current terminal, a second current terminal, and a control terminal;
a reference transistor adjacent to the primary transistor formed within the semiconductor substrate, the reference transistor having a first current terminal, a second current terminal, and a control terminal; and
a bias controller configured to operate the primary transistor at a desired operating point by:
applying predetermined bias voltages to the current terminals and the control terminal of the reference transistor;
measuring a reference electrical current level flowing between the first current terminal and the second current terminal of the reference transistor; and
applying bias voltages configured to operate the primary transistor at the desired operating point that are derived from the reference current level to the primary transistor;
wherein the device further comprises:
a first gate metallization area of the semiconductor substrate that is electrically coupled to the control terminal of the primary transistor;
a second gate metallization area of the semiconductor substrate that is electrically coupled to the control terminal of the reference transistor; and
a shared metallization area of the semiconductor substrate that is coupled to both the first current terminal of the primary transistor and to the first current terminal of the reference transistor;
wherein the shared metallization area includes a metallized extension that is disposed between the first gate metallization area and the second gate metallization area and the metallized extension is configured to shield the control terminal of the reference transistor from alternating-current signals applied to the current terminal of the primary transistor; and
wherein the shared metallization area is configured such that the first current terminal of the reference transistor is electrically coupled to the first current terminal of the primary transistor through the shared metallization area.

2. A semiconductor device, comprising:
a primary transistor formed within a semiconductor substrate, the primary transistor having a first current terminal, a second current terminal, and a control terminal;
a reference transistor adjacent to the primary transistor formed within the semiconductor substrate, the reference transistor having a first current terminal, a second current terminal, and a control terminal;
a first gate metallization area of the semiconductor substrate that is electrically coupled to the control terminal of the primary transistor;
a second gate metallization area of the semiconductor substrate that is electrically coupled to the control terminal of the reference transistor; and
a shared metallization area of the semiconductor substrate that is coupled to both the first current terminal of the primary transistor and to the first current terminal of the reference transistor;
wherein the shared metallization area includes a first metallized extension that is disposed between the first gate metallization area and the second gate metallization area and the first metallized extension is configured to shield the control terminal of the reference transistor from alternating-current signals applied to the current terminal of the primary transistor; and
wherein the shared metallization area is configured such that the first current terminal of the reference transistor is electrically coupled to the first current terminal of the primary transistor through the shared metallization area.

3. The semiconductor device of claim 2, wherein the shared metallization area further includes a second metallized extension that is disposed between a first drain metallization area of the semiconductor substrate that is electrically coupled to the second current terminal of the primary transistor and a second drain metallization area of the semiconductor substrate electrically coupled to the second current terminal of the reference transistor.

4. The semiconductor device of claim 2,
wherein the primary transistor is formed within a first portion of the semiconductor substrate and the reference transistor is formed within a second portion of the semiconductor substrate; and
wherein the first portion of the semiconductor substrate and the second portion of the semiconductor substrate are disposed on opposite sides of the common metalized area.

5. The semiconductor device of claim 2,
wherein the first gate metallization area is separated from the second gate metallization area by a first metallized extension of the shared metallization area that is spaced apart from both the first gate metallization area and the second gate metallization area.

6. The semiconductor device of claim 5,
wherein the first metallized extension of the shared metallization area extends in a first direction and is disposed between the first gate metallization area and the second gate metallization area.

7. The semiconductor device of claim 6,
wherein a second metallized extension of the shared metallization area extends in a second direction that is at least partially orthogonal to the first direction;

wherein the second metallized extension of the shared metallization area is disposed between a first drain metallization area electrically coupled to the second current terminal of the primary transistor and a second drain metallization area electrically coupled to the second current terminal of the reference transistor; and wherein the second metallized extension of the shared metallization area is spaced apart from both the first drain metallization area and the second drain metallization area.

8. The semiconductor device of claim 2, wherein the shared metallization area is coupled to a reference voltage node of the semiconductor substrate by one or more electrically conductive vias within the semiconductor substrate.

9. The semiconductor device of claim 2, wherein an edge of the first gate metallization area closest to the second gate metallization area is separated from the second gate metallization area by a distance in an inclusive range between 10 μm and 50 μm.

10. The semiconductor device of claim 2, further comprising;

a set of two or more electrically conductive source electrode fingers of the primary transistor that are coupled to the shared metallization area;

a set of two or more electrically conductive drain electrode fingers of the primary transistor in an interdigitated arrangement with the source electrode fingers; and a set of two or more electrically conductive gate metallization area fingers of the primary transistor that are disposed in an interdigitated arrangement with the source electrode fingers and the drain electrode fingers.

11. The semiconductor device of claim 2, wherein the first gate metallization area, the second gate metallization area, and the shared metallization area are formed from a single layer of conductive material on the surface of the semiconductor substrate.

12. A method of forming a semiconductor device, comprising:

forming a primary transistor within a semiconductor substrate, the primary transistor having a first current terminal, a second current terminal, and a control terminal;

forming a reference transistor adjacent to the primary transistor within the semiconductor substrate, the reference transistor having a first current terminal, a second current terminal, and a control terminal;

forming a first gate metallization area of the semiconductor substrate that is electrically coupled to the control terminal of the primary transistor;

forming a second gate metallization area of the semiconductor substrate that is electrically coupled to the control terminal of the reference transistor; and forming a shared metallization area of the semiconductor substrate that is coupled to both the first current terminal of the primary transistor and to the first current terminal of the reference transistor;

wherein forming the shared metallization area includes forming a first metallized extension that is disposed between the first gate metallization area and the second gate metallization area;

wherein the first metallized extension is configured to shield the control terminal of the reference transistor from alternating-current signals applied to the current terminal of the primary transistor; and wherein the shared metallization area is configured such that the first current terminal of the reference transistor is electrically coupled to the first current terminal of the primary transistor through the shared metallization area.

13. The method of claim 12, wherein the shared metallization area further includes a second metallized extension that is disposed between a first drain metallization area of the semiconductor substrate that is electrically coupled to the second current terminal of the primary transistor and a second drain metallization area of the semiconductor substrate electrically coupled to the second current terminal of the reference transistor.

14. The method of claim 12, wherein the primary transistor is formed within a first portion of the semiconductor substrate and the reference transistor is formed within a second portion of the semiconductor substrate; and wherein the first portion of the semiconductor substrate and the second portion of the semiconductor substrate are disposed on opposite sides of the common metalized area.

15. The method of claim 12, wherein the first gate metallization area is separated from the second gate metallization area by a first metallized extension of the shared metallization area that is spaced apart from both the first gate metallization area and the second gate metallization area.

16. The method of claim 15, wherein the first metallized extension of the shared metallization area extends in a first direction and is disposed between the first gate metallization area and the second gate metallization area.

17. The method of claim 16, further comprising:

forming a second metallized extension of the shared metallization area extends in a second direction that is at least partially orthogonal to the first direction;

wherein the second metallized extension of the shared metallization area is disposed between a first drain metallization area electrically coupled to the second current terminal of the primary transistor and a second drain metallization area electrically coupled to the second current terminal of the reference transistor; and wherein the second metallized extension of the shared metallization area is spaced apart from both the first drain metallization area and the second drain metallization area.

18. The method of claim 12, further comprising;

forming a set of two or more electrically conductive source electrode fingers of the primary transistor that are coupled to the shared metallization area;

forming a set of two or more electrically conductive drain electrode fingers of the primary transistor in an interdigitated arrangement with the source electrode fingers; and forming a set of two or more electrically conductive gate metallization area fingers of the primary transistor that are disposed in an interdigitated arrangement with the source electrode fingers and the drain electrode fingers.

* * * * *